(12) United States Patent
Florea et al.

(10) Patent No.: US 8,904,264 B2
(45) Date of Patent: *Dec. 2, 2014

(54) ERROR CORRECTION ENCODING METHOD, DECODING METHOD AND ASSOCIATED DEVICES

(75) Inventors: Alina Alexandra Florea, Montigny le Bretonneux (FR); Hang Nguyen, Bretigny sur Orge (FR); Laurent Martinod, Le Chesnay (FR); Christophe Molko, Villepreux (FR)

(73) Assignee: Cassidian SAS, Elancourt (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/004,800

(22) PCT Filed: Mar. 14, 2012

(86) PCT No.: PCT/EP2012/054499
§ 371 (c)(1),
(2), (4) Date: Sep. 12, 2013

(87) PCT Pub. No.: WO2012/123511
PCT Pub. Date: Sep. 20, 2012

(65) Prior Publication Data
US 2014/0006909 A1    Jan. 2, 2014

(30) Foreign Application Priority Data

Mar. 15, 2011   (FR) ...................................... 11 52105

(51) Int. Cl.
*H03M 13/03*     (2006.01)
*H03M 13/39*     (2006.01)
(Continued)

(52) U.S. Cl.
CPC ........... *G06F 11/10* (2013.01); *H03M 13/3905* (2013.01); *H03M 13/356* (2013.01); *H03M 13/6362* (2013.01); *H03M 13/27* (2013.01);
(Continued)

(58) Field of Classification Search
CPC ..... H03M 13/23; H03M 13/27; H03M 13/29; H03M 13/2957
USPC .......................................... 714/786; 375/261
See application file for complete search history.

(56) References Cited

U.S. PATENT DOCUMENTS 5,446,747 A    8/1995   Berrou

FOREIGN PATENT DOCUMENTS

WO           96/32781       10/1996

OTHER PUBLICATIONS

Frank Burkert et al., "'Turbo' Decoding with Unequal Error Protection Applied to GSM Speech Coding", Global Telecommunications Conference, vol. 3, Nov. 18, 1996, pp. 2044-2048.

(Continued)

*Primary Examiner* — Shelly A Chase
(74) *Attorney, Agent, or Firm* — Greer, Burns & Crain, Ltd.

(57) ABSTRACT

An error correction encoding method is provided for encoding source digital data, having the form of a frame, wherein the data can be classified into N classes, where N is an integer at least equal to 2.
The encoding method includes:
  a first step of recursive systematic convolutional encoding of the data of the class 1;
  an implementation of the following steps, for each n ranging from 1 to M, where M is a positive integer equal to or lower than N−1:
    $n^{th}$ mixing ($108_{n+1}$) of a set formed by data of the class n+1 ($102_{n+1}$), the systematic data and the parity data from a preceding encoding step; and
    $(n+1)^{th}$ recursive systematic convolutional encoding ($110_{n+1}$) of data formed by the result of $n^{th}$ mixing.
A decoding method is provided for decoding encoded data with the encoding method, using an associated encoding device and a decoding device.

15 Claims, 3 Drawing Sheets

(51) Int. Cl.
*G06F 11/10* (2006.01)
*H03M 13/35* (2006.01)
*H03M 13/00* (2006.01)
*H03M 13/27* (2006.01)
*H03M 13/45* (2006.01)
*H03M 13/29* (2006.01)
*H04L 1/00* (2006.01)

(52) U.S. Cl.
CPC ............... *H04L 1/007* (2013.01); *H03M 13/45* (2013.01); *H03M 13/2972* (2013.01); *H04L 1/0059* (2013.01); *H03M 13/296* (2013.01)
USPC .......................................................... 714/786

(56) References Cited

OTHER PUBLICATIONS

S. Benedetto et al., "Soft-Input Soft-Output Modules for the Construction and Distributed Iterative Decoding of Code Networks", European Transactions on Telecommunications, vol. 9, No. 2, Mar. 1, 1998, pp. 155-172.

Ralph Jordan et al., "Woven Convolutional Codes and Unequal Error Protection", ISIT, Washington, D.C. Jun. 24-29, 2001, p. 299.

Du Peng et al., "Woven Convolutional Codes and a New Iterative Decoding Algorithm", IEEE International Symposium on Personal, Indoor and Mobile Radio Communication Proceedings, 2003, pp. 1873-1875.

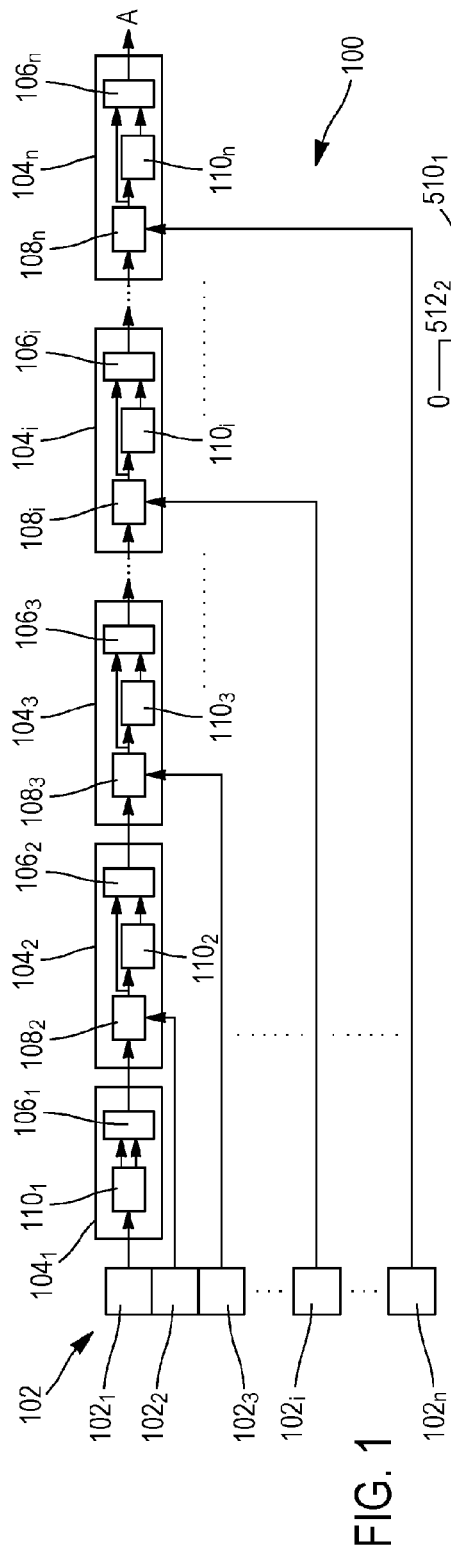
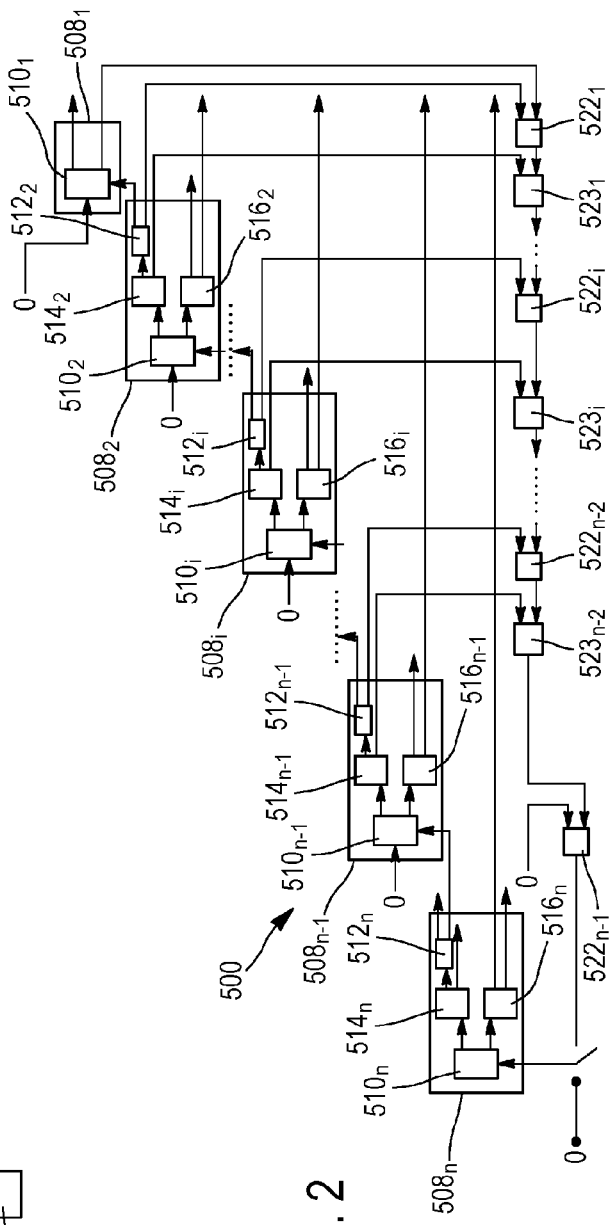
FIG. 1
FIG. 2

ERROR CORRECTION ENCODING METHOD, DECODING METHOD AND ASSOCIATED DEVICES

TECHNICAL FIELD

The present invention relates to an error correction encoding method.

It also relates to a decoding method adapted to decode data that have been encoded using the error correction encoding method according to the invention.

It also relates to an encoding device for implementing the error correction encoding method according to the invention, as well as a decoding device for implementing the decoding method according to the invention.

The field of the invention is that of encoding digital data, for being transmitted in particular in the presence of a transmission noise, and of decoding said digital data after transmission.

The invention more particularly but in a non-limiting way relates to the field of optimization of digital data transmission, for example via a wide band radio network.

BACKGROUND

In telecommunications, error correction encoding methods (also called Forward Error Correction (FEC)) are used to protect so-called source data to be transmitted, from errors that will come from the transmission. To do this, redundancy is added to the source data in order to enable the recipient to detect and correct part of the errors.

The error correction encoding is followed with a modulation for transmission, that is why generally, the modulation and coding scheme (MCS) is used to designate both the error correction encoding and the modulation.

In prior art is known an error correction encoding method commonly called "turbo code". This is an error correction encoding method, implementing in parallel at least two independent steps of systematic convolutive encoding of all the data to be encoded, and at least one time interleaving step changing the order for taking into account data for each of the encoding steps. Turbo codes are for example presented in French patent FR2675971. The decoding implements an iterative decoding algorithm based on the Bahl, Cocke, Jelinek and Raviv algorithm and an a posteriori maximum search.

SUMMARY

One drawback of turbo codes however is that all the source data are equally protected.

UEP (Unequal Error Protection) codes, born with GSM technology, bring a response to this drawback by enabling digital data of a frame to be gathered into different classes depending on their importance, and each class to be protected depending on its priority level (a priority level all higher is assigned as the datum is important).

This principle enables transmission resources as well as the frequency band width used to be optimized.

A known drawback of UEP codes is that each class is separately processed. The different classes are first separated, and then separately encoded. The encoded data of each class are then separately modulated. After transmission, the data of a same frame are thus decorrelated. This involves a resource loss because there is for example a need for:

further headers (that is further data used for defining a data packet, for example the data of a class in the case where the different classes are independently processed), and further processings to resynchronize the data from different classes of a same frame after transmission.

Further, this resynchronization steps generate reception delays.

Such a resource loss goes against the current demand for a higher transmission rate, higher network capacity and shorter transmission delay.

One purpose of the present invention is to provide error correction encoding/decoding methods and devices which do not have the drawbacks of prior art.

Another purpose of the present invention is to provide error correction encoding/decoding methods and devices which minimize the transmission and reception delays, in particular for applications such as sound or video transmission.

Another purpose of the present invention is to provide error correction encoding/decoding methods and devices which are less resource-heavy than the methods and devices of prior art.

Another purpose of the present invention is to provide error correction encoding/decoding methods and devices which require fewer transmission rates than the methods and devices of prior art.

Finally, one purpose of the present invention is to provide error correction encoding/decoding methods and devices which require less network capacity than the methods and devices of prior art.

The invention enables at least one of these purposes to be achieved by an error correction encoding method for encoding in series so-called source digital data, in the form of a frame, wherein said data can be classified into N classes, where N is an integer equal to at least 2.

The encoding method according to the invention comprises:

a first step of recursive systematic convolutional encoding of the data of the class 1;

an implementation of the following steps, for each n ranging from 1 to M, where M is a positive integer equal to or lower than N−1:

$n^{th}$ mixing of a set formed by the data of the class n+1, the systematic data and parity the data from a preceding encoding step;

$(n+1)^{th}$ recursive systematic convolutional encoding of data formed by the result of the $n^{th}$ mixing.

Several intermediate encoding steps of the same data can also be provided before adding new information to be encoded.

It is thus a $n^{th}$ mixing of a set formed by data of the class n+1, systematic data and parity data from a preceding encoding step because the preceding encoding step can be the encoding step n;

the preceding encoding step can be an intermediate encoding step.

The terms "parity datum" and "systematic datum" are terms relating to the recursive systematic convolutional codes, and are known to those skilled in the art.

Throughout the text, the systematic data and parity data can comprise tail bits.

They correspond to the two outputs of a recursive systematic convolutional code.

The systematic data and parity data of an encoding step form the data encoded by said encoding step.

The systematic datum is preferably identical to the datum to be encoded, whereas the parity datum can correspond to at least one redundancy datum.

The invention advantageously provides for adding new information to be encoded, before some of the encoding steps.

Thus, a UEP type error correction encoding method is performed, that is with a non-uniform protection, wherein each class can benefit from a different protection with respect to errors occurring in particular during the transmission on a channel.

The invention takes up the general principle of turbo codes, since there are successive encoding steps and mixing steps in view of a further encoding of the same data. However, the known scheme has been changed to result in an encoding scheme wherein different source digital data of a same frame are more or less protected.

The different protection comes from a different number of redundancy information (or encoded data), as a function of the number of times the data of the class have been encoded.

Each class can indeed be encoded a different number of times, depending on a number of encodings performed taking into account the data of this class. The data of a class can be taken into account for an encoding, as data of the class 1, as data of the class n+1 and/or as data to be encoded formed by the result of the $n^{th}$ mixing.

The method according to the invention is adapted to process entire frames.

The data protection can be called hierarchical, wherein more important data, in other words with a higher priority level, can be better protected.

The structure can be adapted to any frame type, regardless in particular of the number of classes.

A UEP encoding is performed which is directly applicable to an entire frame of digital data.

Each class of a frame can thus be encoded with a dedicated encoding scheme different from the encoding scheme applied to one or more other classes of the same frame.

The method according to the invention thus enables an encoding to be performed with fewer resources than state of the art methods.

Besides, the method according to the invention enables a quicker encoding to be performed by consuming less power than state of the art methods.

Finally, data encoded with the method according to the invention can be transmitted with fewer transmission rates and less network capacity than data encoded with prior art methods and devices, with an equal protection.

The method according to the invention enables the different classes of a same frame to be encoded by a single error correction encoding method, unlike known UEP encoding methods wherein each class is encoded independently from the other classes of the same frame.

It is no longer necessary to separate data of different classes of a same frame into several data flows, to encode them separately.

The method according to the invention thus enables the transmission of synchronization information to be avoided, and thus the resources of the transmission network to be optimized.

The method according to the invention thus enables a reception delay to be reduced, in particular for applications such as sound (for example voice) or video transmission.

The method according to the invention thus enables a resynchronization step to be avoided after transmission.

The method according to the invention thus enables the modulation of data that have been encoded to be simplified, wherein all the classes of a frame can be modulated together. It enables a single modulation scheme to be applied.

The at least one mixing step can provide a random distribution of the digital data in the final result.

The digital data can be any digital datum, in particular digital data representing a video or a voice.

The encoding method is preferably followed by a suitable modulation adapted to the transmission channel used.

The encoding and modulation scheme that can then be obtained is particularly robust to errors.

Some data of the frame can be provided not to be encoded.

An implementation of the puncturing can be provided following the implementation of a coding step. This can involve at least one depuncturing step during a decoding. The depuncturing consists in retrieving data of the same size as data before a corresponding puncturing, for example by introducing zeros in the punctured data.

Preferably, a priority level is assigned to each class, the classes 1 to N being ranked in the decreasing order of the priority levels.

The method according to the invention thus enables each class to benefit from an adapted protection. Thereby, it enables the transmission of more redundancy information than necessary to be avoided, which enables the resources of the transmission network to be optimized while obtaining an optimum reception quality, since the most important information have been highly protected.

Each mixing step can consist in a simple concatenation.

Advantageously, each mixing step consists in an interleaving.

An interleaving can consist in organizing received data non-contiguously. Any type of known interleaving can be considered, in particular interleavings developed within the scope of turbo codes.

Generally, errors during a transmission on a channel occur in bursts rather than independently. If the number of errors exceeds the capacity of the error correction encoding, it fails to recover the source data. The interleaving is generally used to aid in solving this problem by changing the order for taking into account same digital data in several encodings, thus creating a more uniform error distribution.

According to a preferred embodiment of the encoding method according to the invention, M is chosen equal to N−1, so that the classes 1 to N are encoded.

Thus, all the source digital data can be protected.

Preferably, at the end of the implementation of all the steps of the encoding method according to the invention, that is at the output, parity data and systematic data corresponding to the result of the $(M+1)^{th}$ encoding step are obtained.

The invention also relates to an encoding device for implementing the in series error correction encoding method according to the invention, capable of encoding so-called source digital data having the form of a frame, wherein said data can be classified into N classes.

The encoding device according to the invention comprises:
 a first recursive systematic convolutional encoding module for encoding data to be encoded formed by the data of the class 1; and
 and let n range from 1 to M, where M is a positive integer equal to or lower than N−1, M sets each formed by a $n^{th}$ mixer followed by a $(n+1)^{th}$ recursive systematic convolutional encoding module, the $n^{th}$ mixer being arranged to receive the data of the class n+1, the systematic data and parity data of a preceding encoding module, and the $(n+1)^{th}$ encoding module being arranged to encode data to be encoded formed by the output of the $n^{th}$ mixer.

The invention also relates to a method for decoding digital data, arranged to decode digital data encoded in accordance with the encoding method of the invention.

The data obtained at the end of the encoding are advantageously transmitted via a a transmission channel.

So-called received data that may be affected by errors occurring in particular during the transmission can therefore be received after transmission.

Advantageously, the decoding method according to the invention is applied to such received data.

For reasons of clarity of the description, a datum before and after transmission is designated in the same way throughout the text.

Particularly advantageously, the decoding method according to the invention is such that, for any j, k, l between M+1 and 1 (inclusive):

- each $j^{th}$ encoding step of the method according to the invention, corresponds to a decoding step j, adapted to decode encoded data resulting from the $j^{th}$ encoding step;
- at the end of each decoding step j, on the one hand so-called "soft" data for an assessment of data of the class j, and on the other hand so-called extrinsic data are obtained;

and the following steps are implemented:

- decoding k; and then
- decoding l≠k as a function of at least one extrinsic datum provided by at least one other decoding step, used as an a priori datum.

Preferably, the a priori data used for a decoding l≠k comprise information relating to the encoded data.

The so-called "a priori" data preferably represent probabilities on encoded data received from the channel.

These probabilities are available before any current decoding of said encoded data received, these probabilistic values coming from a source different from the encoded data received from the channel.

An a priori datum used to decode the encoded data resulting from the $k^{th}$ encoding step can be relating to the parity data and systematic data of this $k^{th}$ encoding step.

The extrinsic data of a bit B advantageously designate the information produced by a decoder (based on the encoded information received from the channel and, if applicable, a priori data), except for the channel and a priori information of the bit B concerned.

These extrinsic data can represent the probability to have received this bit B as a function of values of all the other adjacent bits of the same frame.

The following book can in particular be referred to: Todd K Moon, "Error Correction Coding—Mathematical Methods and Algorithms", John Wiley & Sons 2005.

The extrinsic data resulting from the $j^{th}$ encoding step are preferably relating to the parity data and systematic data of this $j^{th}$ encoding step.

The extrinsic data preferably comprise so-called "a priori" data providing a further datum for assessing the data of other classes.

At each decoding step, an a priori datum can be used.

For the decoding step performed first in the chronological order, the a priori datum is set to zero. Then, each decoding step enables an a priori datum used for another decoding step to be obtained.

Each class can benefit from a different protection with respect to errors. A strongly protected class will benefit from an error rate all the less important upon decoding.

A decoding l≠k as a function of at least one extrinsic datum provided by at least one other decoding step, used as an a priori datum, enables the different encoded classes to benefit from the encoding of the other encoded classes.

A given bit error rate can thus be more quickly achieved for a less protected class. The invention thereby allows energy, redundancy, and delay savings.

Each decoding step can implement an iterative decoding, that is any type of algorithm based on the a posteriori maximum (MAP) search for assessing a posteriori probabilities. This a posteriori maximum can be calculated with the BCJR algorithm (Bahl, Cocke, Jelinek and Raviv algorithm), with a MAP derivation, in particular according to a so-called LOG MAP decoding using a likelihood ratio ("Log Likelihood Probabilities Ratios"), or a so-called MAX LOG MAP decoding, more suitable for the hardware implementation.

Before their use as an a priori datum for a decoding step j, the extrinsic data can be processed. The aim is to retrieve data of the same dimension and in the same order as the data at the output of the corresponding encoding step.

Each decoding step enables the data of a class to be assessed.

Preferably, the data assessments of the data of each class are gradually extracted from the soft data. The aim is to extract at the right moment some data relating to the respective classes.

A decoding step can be performed non successively for any class, regardless of the encoding order.

The first encoding step can be performed for an intermediate class, and the preceding and following decoding steps can be performed in any advantageous order, in particular according to a preset error rate to be achieved for each class.

Advantageously, a decoding step can be successively performed for all the classes n, where n is decreasing, ranging from M+1 to 1.

For any j between M+1 and 2 (inclusive), the decoding method according to the invention can further comprise after each decoding step j, the following operations:

- demultiplexing j of the extrinsic data obtained in the decoding step j, to separate data relating to parity data from so-called useful data relating to systematic data,
- disentangling j−1 of said useful data, the disentangling j−1 performing a function reverse to that implemented in the mixing step j−1, to provide disentangled data;
- demultiplexing the disentangled data to separate a priori data relating to the class j called extracted data from a priori data relating to the classes 1 a j−1 called useful a priori data;
- providing so-called a priori useful data to be used in the decoding step j−1.

Throughout the text, when disentangling is mentioned to, it refers to a given mixing, the disentangling consisting in retrieving the order of the data before said mixing.

For any j between M+1 and 2 (inclusive), the decoding method according to the invention can further comprise after each decoding step j, the following operations:

- disentangling j−1 of the soft data obtained, the disentangling j−1 performing a function reverse to that implemented in the mixing step j−1, to provide disentangled soft data;
- demultiplexing the disentangled soft data to separate soft data relating to the class j called extracted soft data from soft data relating to the classes 1 to j−1.

The extracted soft data are used for assessing the data of the class j.

A specific step for assessing the extracted soft data can further be provided to retrieve the values of the class j.

At least one decoding step j can be reiterated at least once, as a function of a priori data corresponding to extrinsic data provided by at least one decoding step of the data of another class.

At each reiteration of a decoding step, one a priori datum can be used.

Each decoding step can be reiterated at least once, for example between 1 and 5 times.

The decoding step thus reiterated can then be followed by new decoding steps of the data of following or preceding classes.

Before their use for a reiteration of the decoding step j, the extrinsic data can be processed before using at least some of them as a priori data. The aim is to retrieve data of the same dimension and in the same order as the data at the output from the corresponding encoding step.

At least one feedback is thus performed. The decoding method according to the invention can thus be considered as iterative, wherein each new iteration of a decoding step can improve the assessment of the data of the corresponding class.

Information from other classes can thus be used to improve the decoding of a class.

Each class benefits from a different protection with respect to errors. A strongly protected class will benefit from an error rate all the less important during decoding. During decoding, the at least one feedback enables to exploit the fact that during encoding, data corresponding to each of the classes are mixed. The different encoded classes can thereby benefit from the encoding of the other encoded classes.

A given bit error rate can thus be more quickly reached, for a less protected class. The invention thus allows energy savings.

At least one decoding step j can be reiterated at least once as a function of a priori data corresponding to extrinsic data provided by at least one decoding step of the data of another class, and for j between M+1 and 2 (inclusive), and t strictly lower than j, the decoding step j is reiterated as a function of a priori data obtained in the decoding steps t to j−1.

Each decoding step can thus be reiterated using a priori data obtained in decoding steps of classes with higher priority.

In this case, said a priori data can comprise extrinsic information relating to the classes 1 to j−1 and information relating to the parity data of the classes 1 to j−1.

The decoding steps j−1 to t can then be reiterated.

At least one decoding step j can be reiterated at least once as a function of a priori data corresponding to extrinsic data provided by at least one decoding step of the data of another class, and for j between M and 1 (inclusive) and t strictly higher than j, the decoding step j is reiterated as a function of a priori data obtained in the decoding steps t to j+1.

Each decoding step can thus be reiterated using a priori data obtained in decoding steps of classes with a lower priority.

In this case, said a priori data can comprise extrinsic information relating to the classes t to j+1 and information relating to the parity data of the classes t to j+1.

The decoding steps j+1 to t can then be reiterated.

Preferably, a decoding phase comprises the following steps:
the decoding step M+1 is reiterated as a function of a priori data obtained in the decoding steps 1 to M;
the decoding steps M to 1 are reiterated using a priori data corresponding to extrinsic data provided by the preceding decoding step (following the chronological order), so that the decoding steps M+1 to 1 make up a decoding phase;
and the decoding phase is reiterated at least once.

Thus, a feedback is performed on all the decoding steps, and in each decoding phase, the decoding steps are successively performed for all the classes n, where n is decreasing, ranging from M+1 to 1.

From the second iteration, the decoding step M+1 can be performed as a function of a priori data provided by the decoding step 1.

Information from all the other classes can thus be used to improve the decoding of a class.

The invention also relates to a decoding device adapted to implement the decoding method according to the invention.

The decoding device according to the invention can comprise M+1 decoding modules, each decoding module j (where j is an integer between 1 and M+1 inclusive) being capable of decoding encoded data resulting from the $j^{th}$ encoding step of the encoding method according to the invention, and each decoding module j providing so-called extrinsic data able to be used as a priori data for another decoding module, and at least one so-called "soft" datum for an assessment of the class j.

The invention finds an application in all the fields of data transmission and any transmission system, whether it is a wire or a wireless transmission. It can be in particular the field of:
terrestrial radio communications,
aerospace radio communications,
data transmission in robotics or electronics,
audio and/or video applications.

The invention also relates to a computer program product comprising instructions to perform the steps of the encoding method according to the invention when run on a computer device.

The invention also relates to a computer program product comprising instructions to perform the steps of the decoding method according to the invention when run on a computer device.

BRIEF DESCRIPTION OF THE DRAWINGS

FIG. 1 diagrammatically illustrates an example of the so-called "in series" encoding method according to the invention, FIG. 2 diagrammatically illustrates an example of the so-called "in series" decoding method according to the invention.

DETAILED DESCRIPTION

Figure 3:
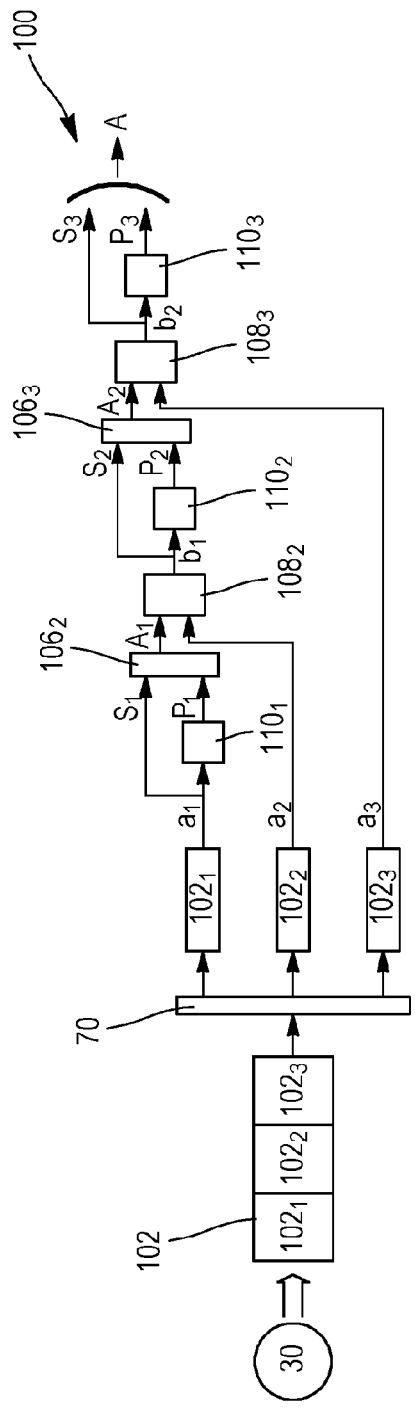
FIG. 3 illustrates a particular embodiment of the so-called "in series" encoding method according to the invention.

Throughout the text, a multiplexing can designate a concatenation, an interleaving or any other operation performed to rank data in a one-dimensional or multidimensional frame.

Throughout the text, when demultiplexing is mentioned to, it refers to a given multiplexing, the demultiplexing being the reverse operation of said multiplexing.

Throughout the text, when deinterleaving is mentioned to, it refers to a given interleaving, the deinterleaving consisting in retrieving the order of data before said interleaving.

The means for implementing each step of the method according to the invention are known to those skilled in the art, consequently only exemplary methods according to the invention will be described in detail.

FIG. 1 is a diagram representation of an example of an in series encoding method in accordance with the method according to the invention.

Each encoding step implements a recursive systematic convolutional code.

In the example represented in FIG. 1, a data frame 102 is encoded. The data of the frame 102 are classified in n classes $102_1$-$102_n$. Each of the classes $102_i$ is associated with a priority level. In the present example, in a non-limiting way, the priority level of the class $102_1$ is greater than the priority level of the class $102_2$, and so on, the class with the lowest priority level being the class $102_n$.

The method 100 comprises a first coding step $104_1$ which comprises:
- an encoding $110_1$ of the data of the class $102_1$, and
- a multiplexing $106_1$ of the data at the output from the encoding $110_1$ which, in the particular case of recursive systematic convolutional codes consists in a systematic output (that is the data to be encoded, at the input of the encoder) and a parity output (or recursively encoded data or parity data).

This step $104_1$ is followed by a second coding step $104_2$ performing:
- an interleaving $108_2$ of the multiplexed data obtained after the multiplexing $106_1$, with the data of the class $102_2$;
- an encoding $110_2$ of the interleaved data provided by the interleaving $108_2$, and
- a multiplexing $106_2$ of the data provided by the encoding $110_2$ which, in the particular case of recursive systematic convolutional codes, consists in a systematic output (that is the data to be encoded, at the input of the encoder) and a parity output (or recursively encoded data or parity data).

The method 100 comprises after step $104_2$, a coding step $104_3$ and so on up to the step $104_n$. Each step $104_i$ for $i \geq 3$ comprises the following operations:
- an interleaving $108_i$ of the multiplexed data provided by the multiplexing $106_{i-1}$ with the data of the class $102_i$;
- an encoding $110_i$ of the interleaved data provided by the interleaving $108_i$; and
- a multiplexing $106i$ of the data provided by the encoding $110_i$.

Each step $104_i$ for $i \geq 2$ provides an encoding datum formed by the multiplexing of the systematic output of the encoding $110_i$ (interleaved data obtained in the interleaving $108_i$) with the parity output of the encoding $110_i$ (parity output obtained in the encoding $110_i$).

In output, the encoded frame A is obtained by the multiplexing $106_n$.

The data of the frame 102 are modulated and transmitted together as the data A, because they are not separated prior to the implementation of the encoding method according to the invention.

The data A are preferably modulated and then transmitted on a transmission channel.

After transmission, the data A that can be affected by errors are received.

FIG. 2 is a diagram representation of an example of an in series decoding method 500 in accordance with the method according to the invention, in the case where each encoder implements a recursive systematic convolutional code.

In the example represented in FIG. 2, data A are decoded. These data A have been encoded in accordance with the in series encoding method 100 according to the invention.

After each multiplexing $106_i$, a puncturing can be provided to be further performed. In this case, the decoding comprises depuncturing steps. This particular case is not represented here, but it is not excluded from the field of the invention.

A first decoding step $508_n$ of the data of the class $102_n$ comprises the following steps:
- a decoding $510_n$ of the encoded data of the class $102_n$, using the data A and an a priori datum (which for the first iteration consists in a series of zero values), and providing so-called extrinsic data as well as soft data for assessing the data of the class $102_n$;
- a demultiplexing $514_n$ of the extrinsic data, to separate the extrinsic data relating to the parity data, and so-called useful extrinsic data relating to the systematic data (relating to the data encoded in the encoding step $104_n$);
- a deinterleaving $512_n$ of the useful extrinsic data (relating to the encoding step $104_n$), to provide a priori data relating to the classes $102_{1 \to n-1}$, and a priori data relating to the class $102_n$, the deinterleaving $512_n$ implementing an interleaving function reverse to the interleaving function implemented in the interleaving $108_n$ of the in series encoding method 100.

The soft data for assessing the data of the class $102_n$ undergo a deinterleaving step $516_n$ implementing an interleaving function reverse to the interleaving function implemented in the interleaving $108_n$ of the in series encoding method 100.

A demultiplexing step not shown enables probabilities for the data of the class $102_n$ (for each bit, probability to be 0 or 1) to be isolated. A step for assessing the data of the class $102_n$ can be further provided.

The deinterleaving $512_n$ is followed by a new decoding step $508_{n-1}$ of the data of the class $102_{n-1}$.

This new step comprises a decoding $510_{n-1}$ of the encoded data of the class $102_{n-1}$, using the a priori data relating to the classes $102_{1 \to n-1}$ obtained in the preceding decoding step, and a channel datum set to zero.

The decoding $510_{n-1}$ provides so-called extrinsic data, and soft data for assessing the data of the class $102_{n-1}$.

The decoding step $508_{n-1}$ then comprises the following steps:
- a demultiplexing $514_{n-1}$ of the extrinsic data to separate the extrinsic data relating to the parity data, from so-called useful extrinsic data relating to the systematic data (relating to the data encoded in the encoding step $104_{n-1}$);
- a deinterleaving $512_{n-1}$ of the useful extrinsic data (relating to the encoding step $104_{n-1}$), to provide a priori data relating to the classes $102_{1 \to n-2}$, and a priori data relating to the class $102_{n-1}$, the deinterleaving $512_{n-1}$ implementing an interleaving function reverse to the interleaving function implemented in the interleaving $108_{n-1}$ of the in series encoding method 100.

The soft data for assessing the data of the class $102_{n-1}$ undergo a deinterleaving step $516_{n-1}$ implementing an interleaving function reverse to the interleaving function implemented in the interleaving $108_{n-1}$ of the in series encoding method 100.

A demultiplexing step not shown enables probabilities for the data of the class $102_{n-1}$ (for each bit, probability to be 0 or 1) to be isolated. A step for assessing the data of the class $102_{n-1}$ can be further provided The method 500 comprises after the step $508_{n-1}$, a decoding step $508_{n-2}$ and so on up to the step $508_2$. Each of the step $508_i$ for $n-2 \geq i \geq 2$ comprises the following operations:
- a decoding $510_i$ of the encoded data of the class $102_i$, using the a priori data relating to the classes $102_{1 \to i}$ obtained in the preceding decoding step, and a channel datum set to zero;
- a demultiplexing $514_i$ of the extrinsic data to separate the extrinsic data relating to the parity data, and the so-called useful extrinsic data relating to the systematic data (relating to the data encoded in the encoding step $104_i$);

a deinterleaving $512_i$ of the useful extrinsic data (relating to the encoding step $104_i$), to provide a priori data relating to the classes $102_{1 \to i-1}$, an a priori data relating to the class $102_i$, the deinterleaving $512_i$ implementing an interleaving function reverse to the interleaving function implemented in the interleaving $108_i$ of the in series encoding method 100.

The soft data for assessing data of the class $102_i$ undergo a deinterleaving step $516_i$ implementing an interleaving function reverse to the interleaving implemented in the interleaving $108_i$ of the in series encoding method 100.

A demultiplexing step not shown enables probabilities for the data of the class $102_i$ (for each bit, probability to be 0 or 1) to be isolated. A step for assessing the data of the class $102_i$ can be further provided.

The method 500 comprises after the step $508_2$, a decoding step $508_1$ comprising the following steps:
- a decoding $510_1$ of the encoded data of the class $102_1$, using the a priori data relating to the classes $102_1$ obtained in the preceding decoding step, and a channel datum set to zero, to obtain the extrinsic data (relating to the parity data and to the so-called useful systematic data, and corresponding to the data encoded in the encoding step $104_1$) and the assessment relating to the encoded data of the class $102_1$.

The steps described since the decoding $510_n$ are called a decoding phase.

The decoding method 500 adapted to the in series encoding further comprises a feedback, which consists in using extrinsic data provided by a decoding step to reiterate another decoding step.

The extrinsic data used for a reiteration of a decoding step are interleaved to retrieve data of the same dimension and in the same order as the data at the output from a corresponding encoding step.

The feedback comprises the following steps:
- interleaving $522_1$ extrinsic data provided by the decoding step $510_1$ and a priori data relating to the class $102_2$, to obtain interleaved data provided by the interleaving $522_1$, the interleaving $522_1$ implementing an interleaving function similar to the interleaving function implemented in the interleaving $108_2$ of the in series encoding method 100, and then multiplexing $523_i$ the interleaved data provided by the interleaving $522_1$ with the extrinsic data relating to the parity data of the class $102_2$;
- for i ranging from 2 to n–2, i interleaving steps $522_i$ of the data multiplexed in the multiplexing $523_{i-1}$ with the a priori data relating to the class $102_{i+1}$, to obtain interleaved data provided by the interleaving $522_i$, the interleaving $522_i$ implementing an interleaving function similar to the interleaving function implemented in the interleaving $108_{i+1}$ of the in series encoding method 100, and then multiplexing $523_i$ the interleaved data provided by the interleaving $522_i$ with so-called extrinsic data relating to the parity data of the class $102_{i+1}$;
- interleaving $522_{n-1}$ the multiplexed data provided by the multiplexing $523_{n-1}$, with a datum of the size of the a priori data relating to the data of the class $102_n$ but set to zero, the interleaving $522_{n-1}$ implementing an interleaving function similar to the interleaving function implemented in the interleaving $108_n$ of the in series encoded method 100;
- taking into account the data interleaved from the interleaving $522_{n-1}$ as a priori datum during a second iteration of the decoding step $510_n$.

This second iteration of the decoding step $510_n$ can be followed by a third iteration of all the other steps of a decoding phase as described above.

Such a feedback can be implemented several times, for example three to fifteen times. After each iteration, the assessment of the data of each class is improved. After at least five feedbacks, it is no longer always interesting to perform more feedbacks, since the gain on the assessment accuracy is negligible as compared to the further time required for another iteration A particular embodiment of the error correction encoding method 100 according to the invention will now be described in reference to FIG. 3, in the case where each encoder implements a recursive systematic convolutional code.

The so-called source digital date 30 are formed by a frame 102 comprising three classes $102_1$, $102_2$ and $102_3$.

The method 100 according to the invention comprises an initial step 70 of separating the data of each of the classes $102_1$, $102_2$ and $102_3$.

The data of the class $102_1$ are designated by the symbol $a_1$.
The data of the class $102_2$ are designated by the symbol $a_2$.
The data of the class $102_3$ are designated by the symbol $a_3$.

The method 100 according to the invention comprises a first encoding step $110_1$ of the data of the class $102_1$.

Encoded data $P_1$ and $S_1$ are obtained.

The encoded data $P_1$ obtained are called "parity of the class $102_1$" and correspond to redundancy data enabling the data $a_1$ to be retrieved. The encoded data $S_1$ obtained are called "systematic of the class $102_1$".

The method 100 according to the invention then comprises:
- a step $106_2$ of multiplexing the parity $P_1$ with the systematic output $S_1$, to obtain multiplexed data $A_1$; and then
- a step $108_2$ of interleaving the multiplexed data $A_1$ with the data $a_2$ of the class $102_2$.

Interleaved data $b_1$ are obtained.

The interleaved data $b_1$ are then encoded during an encoding step $110_2$, which provides encoded data $P_2$ and $S_2$.

The encoded data $P_2$ obtained are called "parity of $b_1$". These are redundancy data enabling the data $b_1$ to be retrieved. Since the data $b_1$ comprise the mixed data $a_1$ and $a_2$, the number of available redundancy data corresponding to the data $a_1$ is increased.

The encoded data $S_2$ obtained are called "systematic of $b_1$".

The method 100 according to the invention then comprises:
- a step $106_3$ of multiplexing the parity $P_2$ with the systematic output $S_2$, to obtain multiplexed data $A_2$; and then
- a step $108_3$ of interleaving the multiplexed data $A_2$ with the data $a_3$ of the class $102_3$.

Interleaved data $b_2$ are obtained.

The interleaved data $b_2$ are then encoded during an encoding step $110_3$, which provides encoded data $P_3$ and $S_3$.

The encoded data $P_3$ obtained are called "parity of $b_2$". These are redundancy data enabling the data $b_2$ to be retrieved. Since the data $b_2$ comprise the mixed data $a_1$, $a_2$ and $a_3$, the number of available redundancy data corresponding to the data $a_1$ and $a_2$ is increased.

The encoded data $S_3$ obtained are called "systematic of $b_2$".

The data A gathering the parity $P_3$ and the systematic output $S_3$ are obtained in output.

Figure 4:
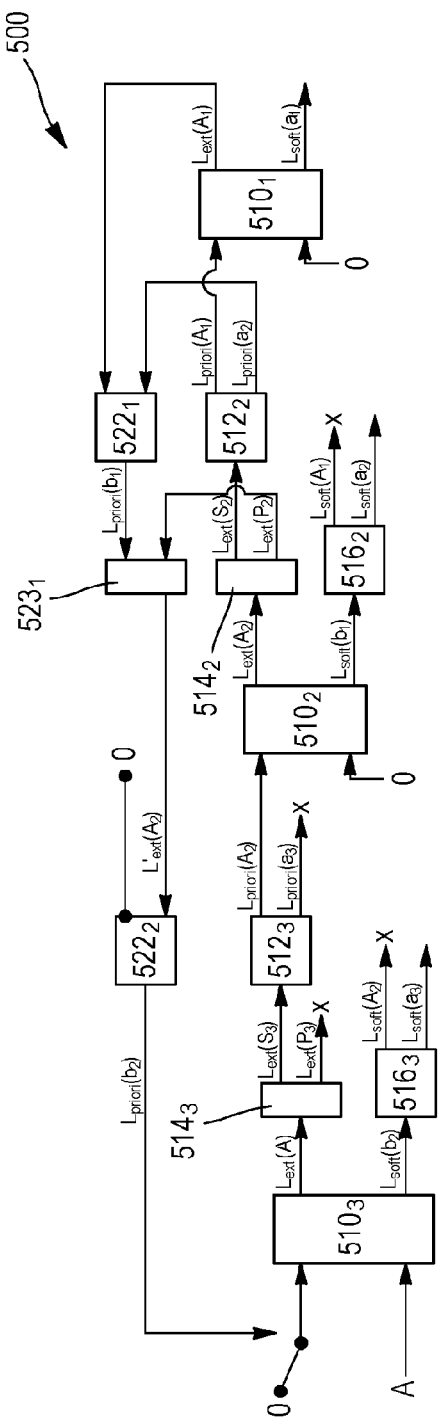
FIG. 4 illustrates a particular embodiment of the so-called "in series" decoding method according to the invention.

A particular embodiment of the decoding method 500 according to the invention will now be described in reference to FIG. 4, corresponding to the encoding method of FIG. 3, and in the case where each encoder implements a recursive systematic convolutional code.

The method 500 according to the invention comprises a first decoding comprising a decoding step $510_3$ using the data A and an a priori datum initially set to zero.

An output $L_{soft}(b_2)$ and so-called extrinsic data $L_{ext}(A)$ are obtained.

The output $L_{soft}(b_2)$ enables the data $b_2$ to be assessed.

Throughout the text, $L_{soft}$, $L_{ext}$ and $L_{priori}$ correspond to the logarithmic probabilities for each data bit to be 0 or 1, resulting from an advantageous use for this particular embodiment of the decoding algorithm called MAX LOG MAP.

On the one hand, the following steps are implemented:
deinterleaving $516_3$ of the output $L_{soft}(b_2)$, the deinterleaving $516_3$ implementing a deinterleaving function reverse to the interleaving function implemented in the interleaving step $108_3$;

not represented demultiplexing for separating the data $L_{soft}(A_2)$ and $L_{soft}(a_3)$.

The output $L_{soft}(a_3)$ corresponds to an assessment of the data $a_3$ of the class $102_3$.

The output $L_{soft}(A_2)$ corresponds to an assessment of the data $A_2$.

So-called extrinsic data $L_{ext}(A)$ comprise information relating to an assessment of the data of the class $102_3$.

On the other hand, the following steps are implemented:
demultiplexing $514_3$ to separate the $L_{ext}(S_3)$ data relating to the systematic $S_3$ from $L_{ext}(P_3)$ relating to the parity $P_3$;
deinterleaving $512_3$ of the output $L_{ext}(S_3)$, the deinterleaving $512_3$ implementing a deinterleaving function reverse to the interleaving function implemented in the interleaving step $108_3$;
not represented demultiplexing of the deinterleaved data, to obtain a datum $L_{priori}(a_3)$ and $L_{priori}(A_2)$.

The $L_{priori}(a_3)$ data correspond to the logarithmic probabilities for each data bit of the class $102_3$ to be 0 or 1.

The $L_{priori}(A_2)$ data are used as a priori information in the following decoding step.

The not represented demultiplexing to obtain a datum $L_{priori}(a_3)$ and $L_{priori}(A_2)$ is followed by a second decoding comprising a decoding step $510_2$ of the parity $P_2$, as a function of $L_{priori}(A_2)$ and a channel datum set to zero.

An output $L_{soft}(b_1)$ and so-called extrinsic data $L_{ext}(A_2)$ are obtained.

The output $L_{soft}(b_1)$ enables the data $b_1$ to be assessed.

On the one hand, the following steps are implemented:
deinterleaving $516_2$ of the output $L_{soft}(b_1)$, the deinterleaving $516_2$ implementing a deinterleaving function reverse to the interleaving function implemented in the interleaving step $108_2$;
not represented demultiplexing for separating the data $L_{soft}(A_1)$ and $L_{soft}(a_2)$.

The output $L_{soft}(a_2)$ corresponds to an assessment of the data $a_2$ of the class $102_2$.

The output $L_{soft}(A_1)$ corresponds to an assessment of the data $A_1$.

So-called extrinsic data $L_{ext}(A_2)$ comprise information relating to an assessment of the data of the class $102_2$.

On the other hand, the following steps are implemented:
demultiplexing $514_2$ to separate the $L_{ext}(S_2)$ data relating to the systematic $S_2$ from $L_{ext}(P_2)$ relating to the parity $P_2$;
deinterleaving $512_2$ of the output $L_{ext}(S_2)$, the deinterleaving $512_2$ implementing a deinterleaving function reverse to the interleaving function implemented in the interleaving step $108_2$;
not represented demultiplexing of the deinterleaved data, to obtain a datum $L_{priori}(a_2)$ and $L_{priori}(A_1)$.

The $L_{priori}(a_2)$ data correspond to the logarithmic probabilities for each data bit of the class $102_2$ to be 0 or 1.

The $L_{priori}(A_1)$ data are used as a priori information in the following decoding step.

The demultiplexing to obtain a $L_{priori}(a_2)$ and $L_{priori}(A_1)$ datum is followed by a third decoding comprising a decoding step $510_1$ of the parity $P_1$, as a function of $L_{priori}(A_1)$ and a channel datum set to zero.

An extrinsic datum $L_{ext}(A_1)$ and an assessment of the data of the class $102_1$ $L_{soft}(a_1)$ are obtained.

The decoding method 500 has a feedback comprising the following steps:
interleaving $522_1$ of the $L_{ext}(A_1)$ and $L_{priori}(a_2)$ data, to obtain an interleaved datum $L_{priori}(b_1)$ and implementing an interleaving function similar to the interleaving function implemented in the interleaving $108_2$ of the series encoding method 100;
multiplexing $523_1$ of the data interleaved in the interleaving $522_1$ with $L_{ext}(P_2)$, to form a datum $L'_{ext}(A_2)$;
interleaving $522_2$ of the $L'_{ext}(A_2)$ and $L'_{ext}(a_3)$ data, to obtain an interleaved datum $L_{priori}(b_2)$, and implementing an interleaving function similar to the interleaving function implemented in the interleaving $108_3$ of the series encoding method 100 ($L'_{ext}(a_3)$ being a datum of the size of $a_3$ but assuming a series of zero values);
new iteration of the decoding step $510_3$, taking into account $L_{priori}(b_2)$ as an a priori datum;
new iteration of the steps following the decoding step $510_3$.

This feedback enables each class to benefit from the decoding accuracy obtained for other classes.

Finally, the classes not much protected can be decoded with a better accuracy than if they had been encoded separately from better protected classes.

Described encodings use for example polynomial generators.

The sizes of the different processed classes can vary.

Some classes can be provided not to be encoded.

Figure 5:
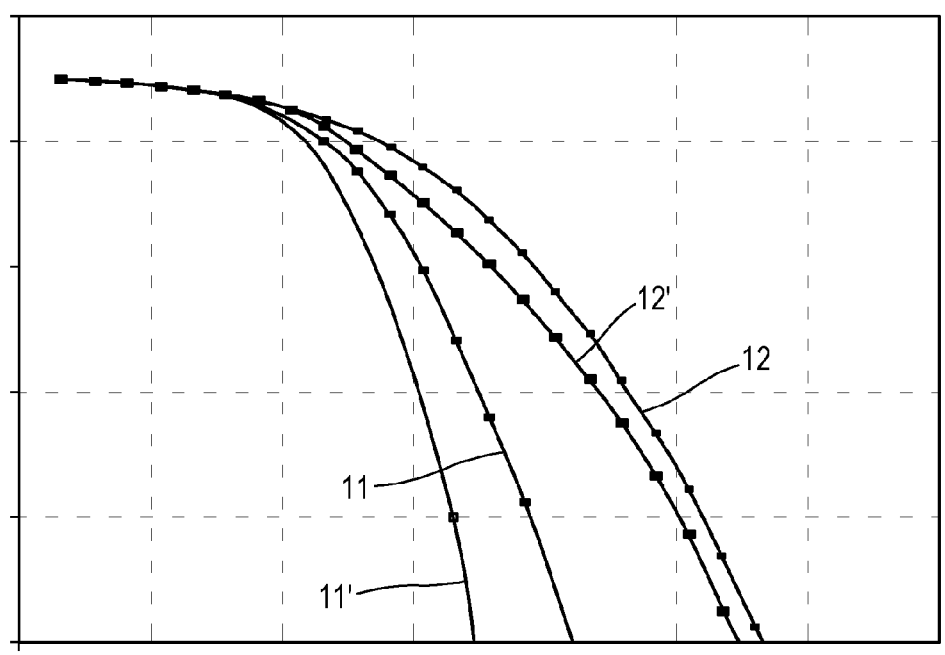
FIG. 5 illustrates bit error rate curves obtained with a decoding method according to the invention.

Bit error rate curves that can be obtained with a decoding method according to the invention are illustrated in FIG. 5.

The bit error rate is the number of erroneous bits in the assessments of the encoded data of a class, divided by the total number of bits analysed by the decoding method according to the invention. It is thus a quantity without unit.

The bit error rate is often expressed as a function of a signal to noise ratio. In FIG. 5, the abscissa axis corresponds to a bit error rate, the ordinate axis corresponds to the Eb/No ratio in dB, that is the ration in dB of an energy per bit to the power spectral density of the noise.

The example has been taken where:
after encoding, a QPSK (Quadrature Phase-Shift Keying) modulation has been implemented on a AWGN (Additive White Gaussian Noise) channel;
the frame 102 only comprises two encoded classes $102_1$ and $102_2$.

In FIG. 5, there is a ratio 2/3 between the size of the class $102_2$ less protected and the size of the frame, and a frame size of 900 bits.

The curve 11 represents the bit error rate associated with the decoding of the class $102_1$, upon the first iteration of the decoding step of the data of the class $102_1$.

The curve 12 represents the bit error rate associated with the decoding of the class $102_2$, upon the first iteration of the decoding step of the data of the class $102_2$.

The curve 11' represents the bit error rate associated with the decoding of the class $102_1$, upon the second iteration of the decoding step of the data of the class $102_1$.

The curve 12' represents the bit error rate associated with the decoding of the class $102_2$, upon the second iteration of the decoding step of the data of the class $102_2$.

Thereby, it can be seen that:

the class $102_1$, which is the first class that has been encoded, reaches upon the first iteration a very good bit error rate, since many redundancy information are available to retrieve the data of the class $102_1$;

the data of the class $102_1$ encoded in the first encoding step benefit from a decoding gain similar to that obtained in a turbo-type decoding upon the second iteration;

at the first iteration, the bit error rate associated with the data of the class $102_2$ is rather low, because there are only little redundancy information available to retrieve the data of the class $102_2$;

after an iteration, the bit error rate associated with the data of the class $102_2$ is remarkably improved, and is closer to the bit error rate obtained for decoding the data of the class $102_1$, benefiting in particular from the turbo decoding gain.

The influence of a more strongly encoded class on a less encoded class depends in particular on the ratio of the size of the first class to the size of the second class, in number of bits.

After five iterations, a bit error rate of $10^{-2}$ can for example be obtained for a signal to noise ratio lower than 2 dB, with a 2.5 dB gain between the first and the last iteration.

This property of the invention is particularly interesting, because it can be seen that each class benefits from the decoding accuracy obtained for the other classes and from the "turbo" effect.

Thus, a given class can be less protected than in prior art, for a given bit error rate.

It can then be seen that fewer redundancy data can be transmitted than in prior art, to obtain a given bit error rate.

Thus, the capacity of a transmission channel for a given coverage is increased.

Thus, the range of the transmission channel for a given capacity is increased.

Of course, the invention is not limited to the examples just described and numerous improvements can be provided to these examples without departing from the scope of the invention.

For example, any decoding type implementing in particular different feedback phases can be considered.

The invention can, for example, be combined with already existing techniques, for example with puncturing techniques, which consist in erasing bits of the already encoded frame to increase the coding ratio. In this case, the redundancy of the code for each class can be reduced.

The invention can also be combined with techniques of prior art consisting in separating data of a same frame, but each data packet gathering several classes and being apt to be processed according to the invention.

The invention claimed is:

1. An error correction encoding method for encoding in series, source digital data having the form of a frame, wherein said data can be classified into N classes, where N is an integer equal to at least 2, comprising the steps of:
   a first step of recursive systematic convolutional encoding of the data of the class 1;
   an implementation of the following steps, for each n ranging from 1 to M, where M is a positive integer equal to or lower than N−1:
   $n^{th}$ mixing of a set formed by the data of the class n+1, the systematic data and the parity data of a preceding encoding step;
   $(n+1)^{th}$ recursive systematic convolutional encoding of data formed by the result of $n^{th}$ mixing.

2. The encoding method according to claim 1, wherein a priority level is assigned to each of the classes, the classes 1 to N that are ranked in the decreasing order of the priority levels.

3. The encoding method according to claim 1, wherein each mixing step consists in an interleaving.

4. An encoding device for implementing the in series error correction encoding method according to claim 1, capable of encoding source digital data having the form of a frame, wherein said data can be classified into N classes, comprising:
   a first recursive systematic convolutional encoding module for encoding data to be encoded formed by the data of the class 1; and
   let n range from 1 to M, where M is a positive integer equal to or lower than N−1, M sets each formed by a $n^{th}$ mixer followed by a $(n+1)^{th}$ recursive systematic convolutional encoding module, the $n^{th}$ mixer that is arranged to receive the data of the class n+1, the systematic data and parity data of a preceding encoding module, and the $(n+1)^{th}$ encoding module that is arranged to encode data to be encoded formed by the output of the $n^{th}$ mixer.

5. A method for decoding digital data, comprising:
   decoding the digital data encoded in series, the digital data having the form of a frame, wherein said data can be classified into N classes, where N is an integer equal to at least 2, further comprising the steps of:
   a first step of recursive systematic convolutional encoding of the data of the class 1;
   an implementation of the following steps, for each n ranging from 1 to M, where M is a positive integer equal to or lower than N−1:
   $n^{th}$ mixing of a set formed by the data of the class n+1, the systematic data and the parity data of a preceding encoding step;
   $(n+1)^{th}$ recursive systematic convolutional encoding of data formed by the result of $n^{th}$ mixing.

6. The decoding method according to claim 5, wherein for any j, k, l between M+1 and 1:
   each $j^{th}$ encoding step of the method according to claim 1 corresponds to a decoding step j, adapted to decode encoded data resulting from the $j^{th}$ encoding step;
   at the end of each decoding step j, wherein soft data for an assessment of the data of the class j, and extrinsic data are obtained;
   and in that the following steps are implemented:
   decoding k; and then
   decoding l≠k as a function of at least one extrinsic data provided by at least one other decoding step, used as an a priori datum.

7. The decoding method according to claim 6, wherein for any j between M+1 and 2, the method further comprises after each decoding step j, the following operations:
   demultiplexing j of the extrinsic data obtained in the decoding step j, to separate data relating to parity data from useful data relating to systematic data,
   disentangling j−1 of said useful data, the disentangling j−1 performing a function reverse to that implemented in the mixing step j−1, to provide disentangled data;
   demultiplexing the disentangled data to separate a priori data relating to the class j called extracted data from a priori data relating to the classes 1 to j−1 called useful a priori data;
   providing a priori useful data to be used in the decoding step j−1.

8. The decoding method according to claim 6, wherein for any j between M+1 and 2, the method further comprises after each decoding step j, the following operations:

disentangling j−1 of the soft data obtained, the disentangling j−1 performing a function reverse to that implemented in the mixing step j−1, to provide disentangled soft data;

demultiplexing the disentangled soft data to separate soft data relating to the class j called extracted soft data from soft data relating to the classes 1 to j−1.

9. The decoding method according to claim 6, wherein at least one decoding step j is reiterated at least once, as a function of a priori data corresponding to extrinsic data provided by at least one decoding step of the data of another class.

10. The decoding method according to claim 9, wherein for j between M+1 and 2 and t strictly lower than j, the decoding step j is reiterated as a function of a priori data obtained in the decoding steps t to j−1.

11. The decoding method according to claim 9, wherein for j between M and 1 and t strictly higher than j, the decoding step j is reiterated as a function of a priori data obtained in the decoding steps t to j+1.

12. The decoding method according to claim 9, wherein a decoding phase comprises the following steps:

the decoding step M+1 is reiterated as a function of a priori data obtained in the decoding steps 1 to M;

the decoding steps M to 1 are reiterated using a priori data corresponding to extrinsic data provided by the preceding decoding step, so that the decoding steps M+1 to 1 make up a decoding phase;

and in that the decoding phase is reiterated at least once.

13. A decoding device configured for decoding digital data encoded in series, the digital data having the form of a frame, wherein said data can be classified into N classes, where N is an integer equal to at least 2, by performing:

a first step of recursive systematic convolutional encoding of the data of the class 1;

an implementation of the following steps, for each n ranging from 1 to M, where M is a positive integer equal to or lower than N−1:

$n^{th}$ mixing of a set formed by the data of the class n+1, the systematic data and the parity data of a preceding encoding step;

$(n+1)^{th}$ recursive systematic convolutional encoding of data formed by the result of $n^{th}$ mixing, said device comprising M+1 decoding modules, each decoding module j being capable of decoding encoded data resulting from the jth encoding step of the method according to claim 1, and each decoding module j providing extrinsic data able to be used as a priori data by another decoding module, and at least one "soft" datum for an assessment of the class j.

14. A computer program product comprising instructions to perform the steps for encoding in series, source digital data having the form of a frame, wherein said data can be classified into N classes, where N is an integer equal to at least 2, when run on a computer device, comprising:

a first step of recursive systematic convolutional encoding of the data of the class 1;

an implementation of the following steps, for each n ranging from 1 to M, where M is a positive integer equal to or lower than N−1:

$n^{th}$ mixing of a set formed by the data of the class n+1, the systematic data and the parity data of a preceding encoding step;

$(n+1)^{th}$ recursive systematic convolutional encoding of data formed by the result of $n^{th}$ mixing.

15. A computer program product comprising instructions to perform the steps for decoding source digital data encoded in series, the digital data having the form of a frame, wherein said data can be classified into N classes, where N is an integer equal to at least 2, when run on a computer device, comprising:

a first step of recursive systematic convolutional encoding of the data of the class 1;

an implementation of the following steps, for each n ranging from 1 to M, where M is a positive integer equal to or lower than N−1:

$n^{th}$ mixing of a set formed by the data of the class n+1, the systematic data and the parity data of a preceding encoding step;

$(n+1)^{th}$ recursive systematic convolutional encoding of data formed by the result of $n^{th}$ mixing.

* * * * *